United States Patent
Tsur et al.

(10) Patent No.: US 12,243,793 B2
(45) Date of Patent: Mar. 4, 2025

(54) INTEGRATED CIRCUIT CHIP STORAGE CONTAINER

(71) Applicant: Sandisk Technologies, Inc., Milpitas, CA (US)

(72) Inventors: Nadav Tsur, Bet Herut (IL); Yair Sommer, Even Yehuda (IL)

(73) Assignee: Sandisk Technologies, Inc., Milpitas, CA (US)

( * ) Notice: Subject to any disclaimer, the term of this patent is extended or adjusted under 35 U.S.C. 154(b) by 474 days.

(21) Appl. No.: 17/750,026

(22) Filed: May 20, 2022

(65) Prior Publication Data

US 2023/0378014 A1    Nov. 23, 2023

(51) Int. Cl.
*B65D 25/56* (2006.01)
*B65D 83/08* (2006.01)
*H01L 23/32* (2006.01)

(52) U.S. Cl.
CPC .............. *H01L 23/32* (2013.01); *B65D 25/56* (2013.01); *B65D 83/0805* (2013.01); *B65D 2585/86* (2013.01)

(58) Field of Classification Search
CPC ..... H01L 23/32; B65D 25/56; B65D 83/0805; B65D 2585/86
USPC ......................................... 206/710, 711, 712
See application file for complete search history.

(56) References Cited

U.S. PATENT DOCUMENTS

| 5,435,446 | A | 7/1995 | Hosseinmardi et al. |
| 8,922,367 | B2* | 12/2014 | Denny ................... G16H 20/13 |
| | | | 604/59 |
| 2009/0152162 | A1* | 6/2009 | Tian .................. H01L 21/67373 |
| | | | 206/710 |
| 2013/0256186 | A1* | 10/2013 | Kim ..................... H01L 21/6735 |
| | | | 206/711 |
| 2023/0264890 | A1* | 8/2023 | Hokari ................... B65D 61/02 |
| | | | 206/454 |

FOREIGN PATENT DOCUMENTS

| CN | 102915934 | 4/2015 |
| CN | 210028393 | 2/2020 |
| CN | 210437779 | 5/2020 |
| JP | 2001253490 | 9/2001 |

* cited by examiner

*Primary Examiner* — Jacob K Ackun
(74) *Attorney, Agent, or Firm* — PATTERSON + SHERIDAN, LLP

(57) ABSTRACT

An integrated circuit (IC) device container/carrier includes a cartridge having a plurality of faces and a device housing slot recessed from one or more of the faces, where each slot is configured to house at least one IC device. The container further includes a lid rotatably coupled with the cartridge, the lid having a window recess configured to align with each device housing slot for accessing corresponding IC devices. At least one of the cartridge faces may be configured as a lock face without a corresponding device housing slot recessed from this lock face.

16 Claims, 3 Drawing Sheets

INTEGRATED CIRCUIT CHIP STORAGE CONTAINER

FIELD OF EMBODIMENTS

Embodiments of the invention may relate generally to integrated circuit (IC) devices or "chips", and particularly to approaches to storing and transporting such chips.

BACKGROUND

Integrated circuits, semiconductor devices, microchips, or simply chips are all terms that commonly refer to a set of electronic circuits on a small flat piece of silicon. Such components are now ubiquitous in the world of computers and electronics. One example of a type of surface-mount packaging used for ICs is a ball grid array ("BGA"), such as a package structure having solder balls on its bottom surface rather than external terminal pins, which is often used to permanently mount devices such as microprocessors. Continuing with the example, unsoldered BGA components in lab and test environments are known to often be kept in trays designed for similar mass production (MP) components, even though each engineer may work on only a few BGA components at a time, Typical tray dimensions for legacy MP trays are usually big and bulky and thus BGA components can easily fall out of such trays, tray assemblies can require more space than desired such as in the context of shipping and on a work station, and the components may simply be damaged as the MP trays are not necessarily designed with lab/test environments in mind. Hence, there is a need for chip carriers or containers for housing; and/or shipping IC packages, generally, from one site or station to the next.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Figure 1A:
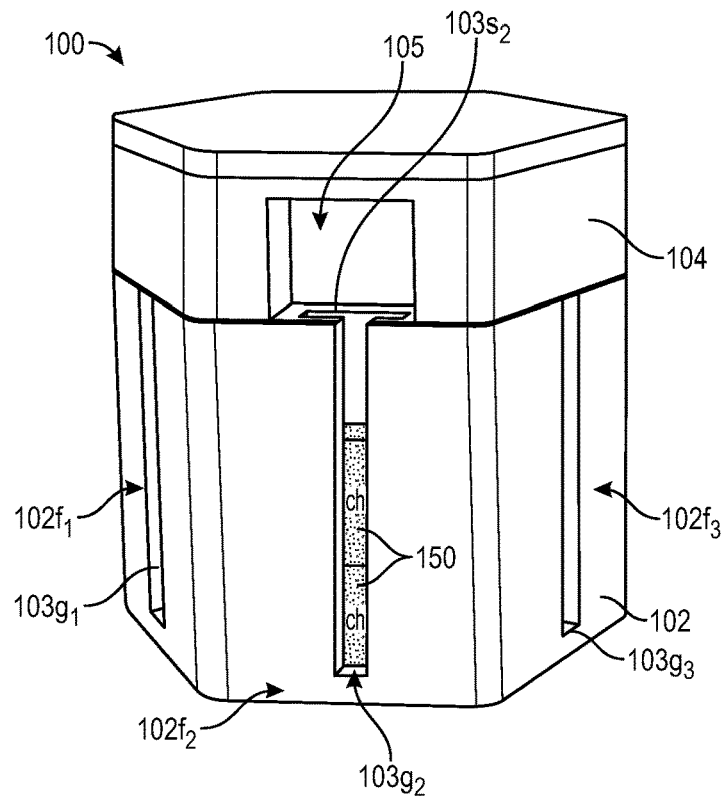
FIG. 1A is a front perspective view illustrating a chip container in an upright and open position, according to an embodiment.

Generally, approaches to an IC chip container or carrier are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

Context

Recall that there is a need for chip carriers or containers for housing and/or shipping IC chip devices/packages. This is especially true in the context of lab, research and development, validation, failure analysis and/or test environments, for example, in which only a few chips at a time may be transported and worked upon. Furthermore, such devices are often shipped in a vacuum bag to avoid moisture and are thus subject to a vacuum and may be damaged if not suitably protected from the vacuum pressure. A desirably functional chip container should be capable of securely and safely housing the chips contained therein, including during shipping and other handling operations, and of being quickly accessed and opened so that the components are readily available for testing, assembly, and the like.

Chip Container/Carrier

Figure 1B:
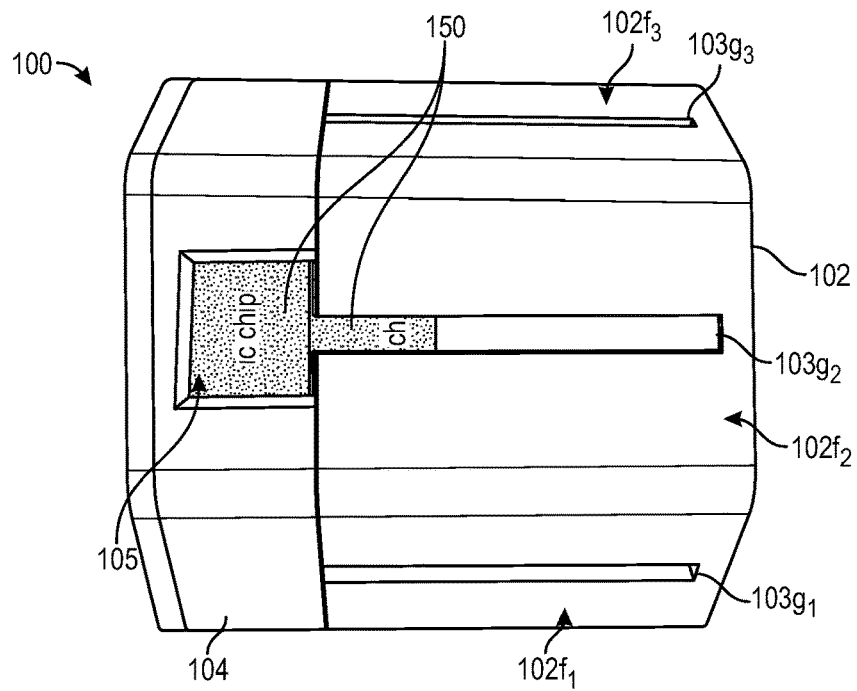
FIG. 1B is a front perspective view illustrating the chip container of FIG. 1A in a sideways and open position, according to an embodiment.
Figure 1C:
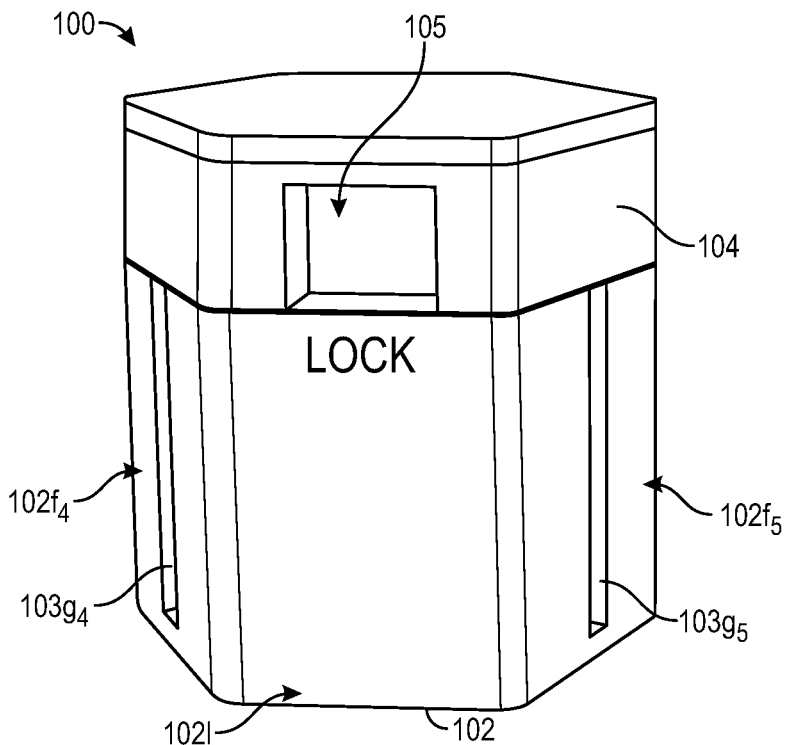
FIG. 1C is a front view illustrating the chip container of FIG. 1A in an upright and locked position, according to an embodiment.

FIG. 1A is a front perspective view illustrating a chip container in an upright and open position, FIG. 1B is a front perspective view illustrating the chip container of FIG. 1A in a sideways and open position, and FIG. 1C is a front view illustrating the chip container of FIG. 1A in an upright and locked position, all according to an embodiment. Chip carrier or container 100 (or simply "container 100") is depicted here as a 3-dimensional hexagonal object having six faces or surfaces, for a non-limiting example, not including the top and bottom faces or surfaces. The shape (and therefore the number of faces) of a chip container disclosed herein, such as container 100, may vary from implementation to implementation and, therefore, is not limited to a hexagonal shape as illustrated and described here throughout.

Figures 2A, 2B:
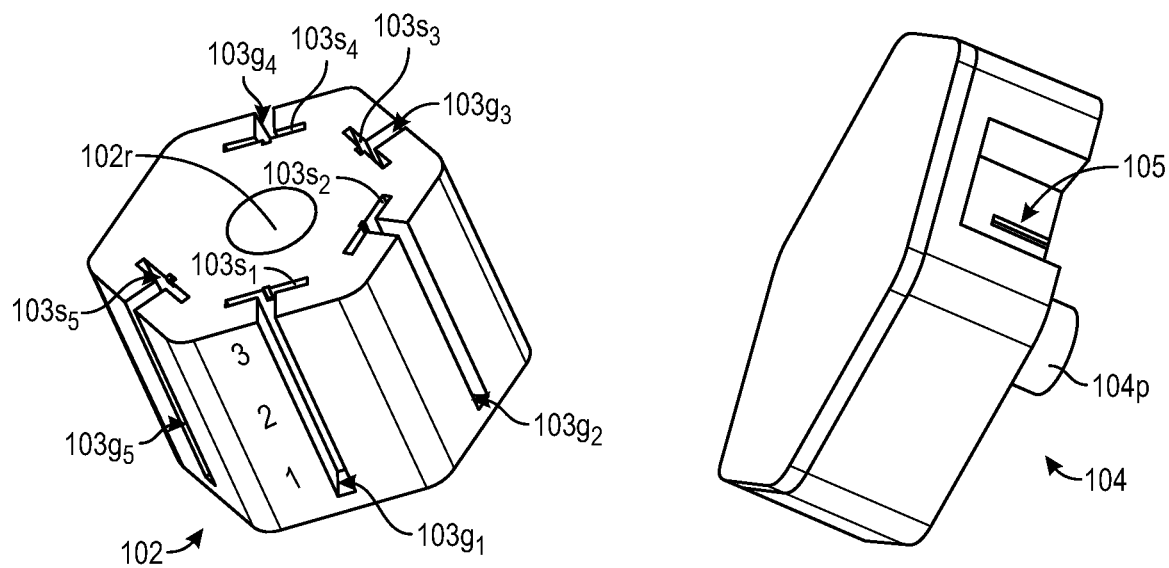
FIG. 2A is a perspective view illustrating a carrier cartridge portion of the chip container of FIG. 1A, according to an embodiment.
FIG. 2B is a perspective view illustrating an access lid portion of the chip container of FIG. 1A, according to an embodiment.

Container 100 comprises a lower/bottom carrier cartridge portion 102, part, component (or simply "cartridge 102") and an upper/top access lid portion 104, part, component (or simply "lid 104"). FIG. 2A is a perspective view illustrating a carrier cartridge portion of the chip container of FIG. 1A, and FIG. 2B is a perspective view illustrating an access lid portion of the chip container of FIG. 1A, both according to an embodiment.

As depicted here in hexagonal form, cartridge 102 of container 100 is configured with six faces total, including five open faces $102f_1$, $102f_2$, $102f_3$, $102f_4$, $102f_5$ ("f" for "face") and a single lock face $102l$ ("l" for "lock"). Each open face $102f_1$-$102f_5$ includes a corresponding groove-slot pair comprising a groove, generally groove $103g$ ("g" for "groove") and a paired slot $103s$ ("s" for "slot"). In an upright position for container 100 (e.g., FIGS. 1A, 1C), each groove $103g_1$, $103g_2$, $103g_3$, $103g_4$, $103g_5$ is referenced and illustrated as a vertical groove extending along the height of the cartridge 102 of container 100 and extends from the outer surface of the corresponding face $102f_1$-$102f_5$ some depth into the body of the cartridge 102. Continuing with reference to the upright position for container 100, each narrow slot $103s_1$, $103s_2$, $103s_3$, $103s_4$, $103s_5$ (FIG. 2A) corresponding to each groove $103g_1$-$103g_5$ is referenced and illustrated as a lateral slot extending along a width direction of a corresponding face $102f_1$-$102f_5$ of the cartridge 102 of container 100 and intersects with its paired groove $103g_1$-$103g_5$ at a terminal or inner end of each groove $103g_1$-$103g_5$. The purpose of each slot $103s_1$-$103s_5$ is to house, hold, secure, carry, contain one or more integrated circuit (IC) device(s), package(s), chip(s), solid-state memory, or the like, illustrated here as a plurality of devices 150 generally labeled "ic chip". Each groove $103g_1$-$103g_5$ provides for visual observation of any devices 150 that may be housed in a corresponding slot $103s_1$-$103s_5$, while also providing a degree of protection to devices 150 housed in each slot $103s_1$-$103s_5$ because of the recession of each slot $103s_1$-$103s_5$ within the body of the cartridge 102 at the inner end of each corresponding groove $103g_1$-$103g_5$ and the envelopment by surrounding material of the cartridge 102. Each slot $103s_1$-$103s_5$ is arbitrarily depicted here as capable of housing three (3) devices 150, for purposes of a non-limiting example, and according to an embodiment may be labeled accordingly such as by the "1", "2", and "3" labeling shown in FIG. 2A. However, the number of devices 150 housed in each slot $103s_1$-$103s_5$ may vary from implementation to implementation based on relevant needs.

As depicted here in hexagonal form, lid 104 of container 100 is also configured with six faces total to match and mate with the six faces $102f_1$-$102f_5$, $102l$ of the cartridge 102, one of which comprises an access window 105. Window 105 is structurally a recess or recessed cavity within the body of the lid 104 and configured in size and shape to present and provide access to each device 150. Therefore, window 105 is configured in size and shape commensurately with the devices 150 (e.g., IC chips) for which a given container 100 may be specifically designed and configured. It is noteworthy that a given chip container 100 may be designed and configured for use with devices 150 generally of any size, where most such devices are typically relatively thin and flat, rectangular in form. Furthermore and according to an embodiment, a given chip container 100 may be designed and configured for use with devices 150 of multiple sizes. As such, different slots $103s_1$-$103s_5$ within a given container 100 may be of different dimensions suitable for corresponding devices 150, with the window 105 configured to accommodate all of the slots $103s_1$-$103s_5$ and corresponding devices 150.

The upright positioning of container 100 in FIG. 1A depicts two devices 150 in a housed position within a corresponding slot $103s_2$ of cartridge 102, with the window 105 of lid 104 aligned therewith. Lid 104 and cartridge 102 are removably or non-permanently coupled together, such as by insertion of a post $104p$ (FIG. 2B) of lid 104 within an orifice or receptacle $102r$ (FIG. 2A) of cartridge 102. Lid 104 and cartridge 102 are rotatably coupled together, such that they are capable of rotation relative to one another. Therefore, in operation lid 104 can be rotated relative to cartridge 102 for alignment of each slot $103s_1$-$103s_5$ of cartridge 102 to the window 105 of lid 104, for access to devices 150 within an aligned slot $103s_1$-$103s_5$. Thus, an operator can physically manipulate the container 100 assembly to allow each device 150 to independently and in turn enter into and be received by the recession of window 150 (e.g., by use of gravity and/or other physical urging), so that the operator can in turn readily remove the device 150 captured within the window 105, such as in the sideways and open position depicted in FIG. 1B. Likewise, in operation lid 104 can be rotated relative to cartridge 102 for alignment of the window 105 of lid 104 with the lock face $102l$ of cartridge 102 (shown labeled with "LOCK" in FIG. 1C), for "locking" devices 150 within their corresponding unaligned slot $103s_1$-$103s_5$. This is because according to an embodiment lock face $102l$ does not have a corresponding groove $103g$/slot $103s$ pair (as can be seen in FIGS. 1C, 2A), thus in such a position devices 150 are not accessible via window 105 because none of the slots $103s_1$-$103s_5$ are aligned with window 105. Thus, an operator can at any time lock the container 100 and the devices 150 contained therein (FIG. 1C), such as for shipping, handling, or other purposes or protective scenarios.

The embodiments of a chip container such as container 100 as described herein are considered a less costly and more secure, compact and thus effective way to store and transport chip devices, as compared to various ad hoc approaches that may be currently used. That is, container 100 may help prevent loss or damage to the electronic devices housed therein, even under a vacuum, may consume less space at a work station and for shipping, and may be easier to use than known prior approaches.

Method of Use

Figure 3:
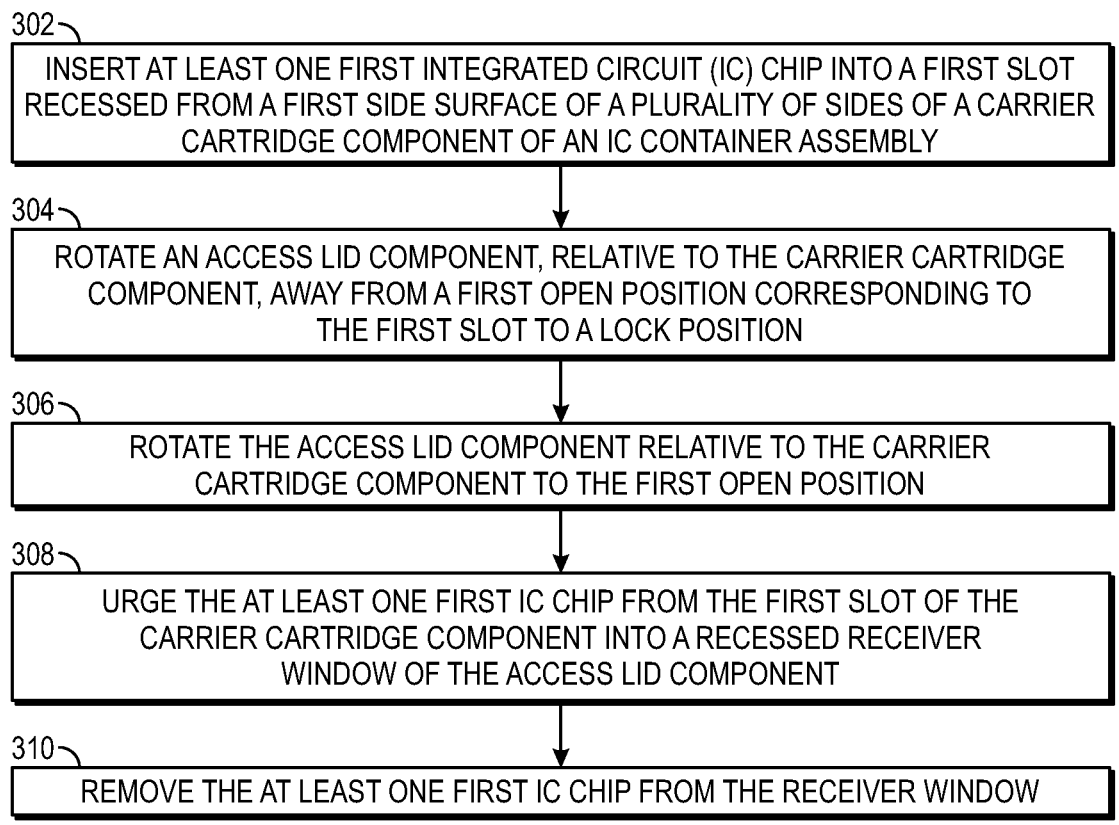
FIG. 3 is a flow diagram illustrating a method of use for the chip container of FIG. 1A, according to an embodiment.

FIG. 3 is a flow diagram illustrating a method of use for the chip container of FIG. 1A, according to an embodiment. The method of FIG. 3 is but one example use of the chip container 100 described herein and, therefore, uses of such a container are not limited only to the method or procedure illustrated in and described in reference to FIG. 3.

At block 302, at least one first integrated circuit (IC) chip is inserted into a first slot recessed from a first side surface of a plurality of sides of a carrier cartridge component of an IC container assembly. For example, one or more IC chip(s)

150 (FIGS. 1A-1B) is inserted into slot $103s_2$ (FIG. 2A) recessed from face $102f_2$ (FIGS. 1A-1B) of cartridge 102 (FIGS. 1A-2A) of container 100 (FIGS. 1A-1C). According to an embodiment, prior to rotating the access lid component to the lock position (block 304), a second IC chip 150 (or more, depending on the capacity of each slot $103s_1$-$103s_5$ of a given container 100) is inserted into the first slot $103s_2$. Each IC chip 150 may be inserted into the cartridge 102 with the lid 104 (FIGS. 1A-1C, 2B) attached thereto via the window 105 (FIGS. 1A-1C, 2B) of lid 104 or, more readily, with the lid 104 removed therefrom. According to an embodiment, at least one second IC chip may be inserted into a second slot recessed from a second side surface of the plurality of sides of the carrier cartridge component, such as a second IC chip 150 inserted into slot $103s_3$ (FIG. 2A) recessed from face $102f_3$ (FIGS. 1A-1B) of cartridge 102, and so on for a multitude of IC chips up to the total capacity of a given container 100.

At block 304, an access lid component is rotated, relative to the carrier cartridge component, away from a first open position corresponding to the first slot to a lock position. For example, lid 104 is rotated relative to cartridge 102 away from an open position (see, e.g., FIGS. 1A-1B) corresponding to the slot $103s_2$ to the lock position illustrated in FIG. 1C, whereby the window 105 of the lid 104 is aligned with the lock face $102l$ (FIG. 1C) of cartridge 102. The container 100 is now in a locked or closed position and the inserted IC chip(s) 150 housed and secured for storage, shipping, handling, transportation, and the like.

At block 306, the access lid component is rotated relative to the carrier cartridge component to the first open position corresponding to the first slot (or any other slot $103s_1$-$103s_5$ from which a loaded device 150 is desired). For example, lid 104 is rotated relative to cartridge 102 away from the lock position corresponding to the lock face $102l$ to the former open position corresponding to slot $103s_2$. The container 100 is now in an opened or access position and the inserted IC chip(s) 150 are accessible.

At block 308, the at least one first IC chip is urged from the first slot of the carrier cartridge component into a recessed receiver window of the access lid component. For example, the container 100 assembly comprising the cartridge 102 and the lid 104 is rotated and/or turned upside down, or the like, to urge the first IC chip 150 to slide or otherwise move within the slot $103s_2$ and into reception in the window 105 of the lid 104. Once the first IC chip 150 is removed (block 310), this operation may be repeated to urge any next IC chip 150 housed within the same slot $103s_2$ into the window 105.

Hence, at block 310, the at least one first IC chip can be removed from the receiver window. For example, the first IC chip 150 is removed from container 100 via the window 105, such as by gravity or shaking or otherwise physically urging out of the container 100 through the window 105. Once the first IC chip 150 is removed, blocks 308-310 may be repeated to remove any additional IC chip(s) housed within the same slot $103s_2$. According to the embodiment in which a second IC chip 150 is inserted into a second slot $103s_3$ of the cartridge 102 (see further embodiment described in reference to block 302), lid 104 may be further rotated relative to the cartridge 102 (as at block 306) to a second open position corresponding to the second slot $103s_3$, for example, the second IC chip urged from the second slot $103s_3$ into the window 105 (as at block 308), and the second IC chip removed from the container 100 (as at block 310).

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. An integrated circuit (IC) device container comprising:
   a cartridge part comprising:
      a plurality of faces, and
      a device housing slot recessed from at least one of the faces, each slot configured to house at least one IC device; and
   a lid part rotatably coupled with the cartridge, the lid part comprising a window recess configured to align with each device housing slot for accessing a corresponding IC device.

2. The container of claim 1, wherein at least one of the plurality of faces is configured as a lock face without a corresponding device housing slot recessed from the lock face.

3. The container of claim 1, wherein the window recess is configured for accessing the corresponding IC device translated from the device housing slot to the window recess.

4. The container of claim 1, wherein the cartridge part further comprises a respective groove extending inward from a corresponding face and intersecting with each device housing slot.

5. The container of claim 4, wherein each groove and corresponding device housing slot intersect to form a T-shape extending along a height of the cartridge part.

6. The container of claim 4, wherein each groove is configured to provide visibility to the corresponding device housing slot.

7. The container of claim 1, comprising a number n of faces and a number n–1 of corresponding device housing slots.

8. The container of claim 1, wherein at least one device housing slot is configured to house a plurality of IC devices.

9. The container of claim 1, wherein each device housing slot is configured having an equal width.

10. The container of claim 1, wherein a first device housing slot is configured having a first width and a second device housing slot is configured having a different second width.

11. A method comprising:
   inserting at least one first integrated circuit (IC) chip into a first slot recessed from a first side surface of a plurality of sides of a carrier cartridge component of an IC container assembly; and rotating an access lid component, relative to the carrier cartridge component, away from a first open position corresponding to the first slot to a lock position.

12. The method of claim 11, further comprising:

rotating the access lid component relative to the carrier cartridge component to the first open position;

urging the at least one first IC chip from the first slot of the carrier cartridge component into a recessed receiver window of the access lid component; and removing the at least one first IC chip from the receiver window.

13. The method of claim 11, further comprising:

inserting at least one second IC chip into a second slot recessed from a second side surface of the plurality of sides of the carrier cartridge component;

rotating the access lid component relative to the carrier cartridge component to the first open position;

urging the at least one first IC chip into a recessed receiver window of the access lid component;

removing the at least one first IC chip from the receiver window;

rotating the access lid component relative to the carrier cartridge component to the second open position;

urging the at least one second IC chip into the recessed receiver window; and removing the at least one second IC chip from the receiver window.

14. The method of claim 13, wherein a first width of the first slot is different from a second width of the second slot.

15. The method of claim 13, wherein a first width of the first slot is same as a second width of the second slot.

16. The method of claim 11, further comprising:

prior to rotating the access lid component to the lock position, inserting a second IC chip into the first slot;

rotating the access lid component relative to the carrier cartridge component to the first open position;

urging the second IC chip into a recessed receiver window of the access lid component;

removing the second IC chip from the receiver window;

urging the first IC chip into the recessed receiver window; and removing the first IC chip from the receiver window.

\* \* \* \* \*